(12) United States Patent
Fan Chiang

(10) Patent No.: US 7,461,686 B2
Fan Chiang
(45) Date of Patent: Dec. 9, 2008

(54) HEAT DISSIPATING DEVICE

(75) Inventor: Li-Wei Fan Chiang, Taoyuan Hsien (TW)

(73) Assignee: Li Yo Precision Industrial Co., Ltd., Taoynan County (TW)

( * ) Notice: Subject to any disclaimer, the term of this patent is extended or adjusted under 35 U.S.C. 154(b) by 310 days.

(21) Appl. No.: 11/374,597

(22) Filed: Mar. 14, 2006

(65) Prior Publication Data

US 2007/0215322 A1 Sep. 20, 2007

(51) Int. Cl.
*H05K 7/20* (2006.01)

(52) U.S. Cl. ................. 165/78; 165/80.3; 165/185; 361/704

(58) Field of Classification Search .............. 165/78, 165/80.3, 185; 361/704
See application file for complete search history.

(56) References Cited

U.S. PATENT DOCUMENTS

| | | | | |
|---|---|---|---|---|
| 5,558,155 A | * | 9/1996 | Ito ...................... | 165/80.3 |
| 6,449,160 B1 | * | 9/2002 | Tsai ...................... | 165/80.3 |
| 7,104,311 B1 | * | 9/2006 | Teng ...................... | 165/80.3 |
| 7,165,601 B1 | * | 1/2007 | Hashimoto ................ | 165/78 |
| 7,251,134 B2 | * | 7/2007 | Liu et al. ................. | 165/185 |
| 7,284,597 B2 | * | 10/2007 | Tang ...................... | 165/80.3 |
| 2004/0150955 A1 | * | 8/2004 | Lin ........................ | 361/709 |

* cited by examiner

*Primary Examiner*—Leonard R Leo

(57) ABSTRACT

A heat dissipating device comprises a plurality of fins. An upper side and a lower side of each fin is folded with folding sheets. Each of two sides of each sheet is protruded with a buckling ear. The buckling ear is formed by a triangular sheet and a support plate. The support plate is connected to one apex of the triangular sheet and the folding sheet. A hole is formed on the folding sheet and is located behind the buckling ear. The shape of the hole is corresponding to that of the buckling ear. A tenon is formed at two lateral walls of the hole and a middle section of the tenon is protruded with a semi-round section. Further, the buckling ear may have a T shape or the triangular sheet can be replaced by a round sheet.

1 Claim, 7 Drawing Sheets

HEAT DISSIPATING DEVICE

FIELD OF THE INVENTION

The present invention relates to heat dissipating devices, and in particular to a heat dissipating device, wherein each fin has buckling ears and holes corresponding to the buckling ears. Each hole is installed with a tenon so that the fins of the heat dissipating device can be firmly secured. The installation work can be performed easily and quickly. Thereby the present invention provides a preferred heat dissipating effect.

BACKGROUND OF THE INVENTION

In the present invention heat dissipating device, a plurality of fins 100 are formed. Each fin 100 has a U shape and has an upper folded edge 200 and a lower folded edge 300 (referring to FIG. 1). Each folding edge 200, 300 has an ear 400. A hole 500 is formed at a rear side of the ear 400. The size of the hole 500 is slightly greater than that of the ear 400. In assembly, the ear 400 of one fin 100 is embedded into the hole 500 of another fin 100 so as to combine two fins 100. The heat dissipating device can be installed to a computer central processing unit. However the prior art ear has a simple structure. Thereby the buckling structure is easily released. Furthermore, the thermal expansion and cold contract increases the problem. This induces a trouble to users and increases the cost. It is necessary to be improved.

SUMMARY OF THE INVENTION

Accordingly, the primary object of the present invention is to provide a heat dissipating device suitable for a computer central processing unit, wherein each fin has buckling ears and holes corresponding to the buckling ears. Each hole is installed with a tenon so that the fins of the heat dissipating device can be firmly secured. The installation work can be performed easily and quickly. Thereby the present invention provides a preferred heat dissipating effect.

To achieve above objects, the present invention provides a heat dissipating device suitable of a computer central processing unit. The device comprises a plurality of fins. An upper side and a lower side of each fin being folded with folding sheets. Each of two sides of each sheet is protruded with a buckling ear. The buckling ear is formed by a triangular sheet and a support plate. The support plate is connected to one apex of the triangular sheet and the folding sheet. A hole is formed on the folding sheet and is located behind the buckling ear. The shape of the hole is corresponding to that of the buckling ear. A tenon is formed at two lateral walls of the hole and a middle section of the tenon is protruded with a semi-round section. Thereby the buckling ear may have a T shape or the triangular sheet can be replaced by a round sheet.

In assembly, the buckling ears of one fin are buckled to the holes of another fin so as to assembly two fins. The tenon serves to buckle the buckling ear to the hole; more fins are assembled by the same way. The heat dissipating device is assembled to a computer central processing unit.

The various objects and advantages of the present invention will be more readily understood from the following detailed description when read in conjunction with the appended drawing.

DETAILED DESCRIPTION OF THE INVENTION

Figure 1:
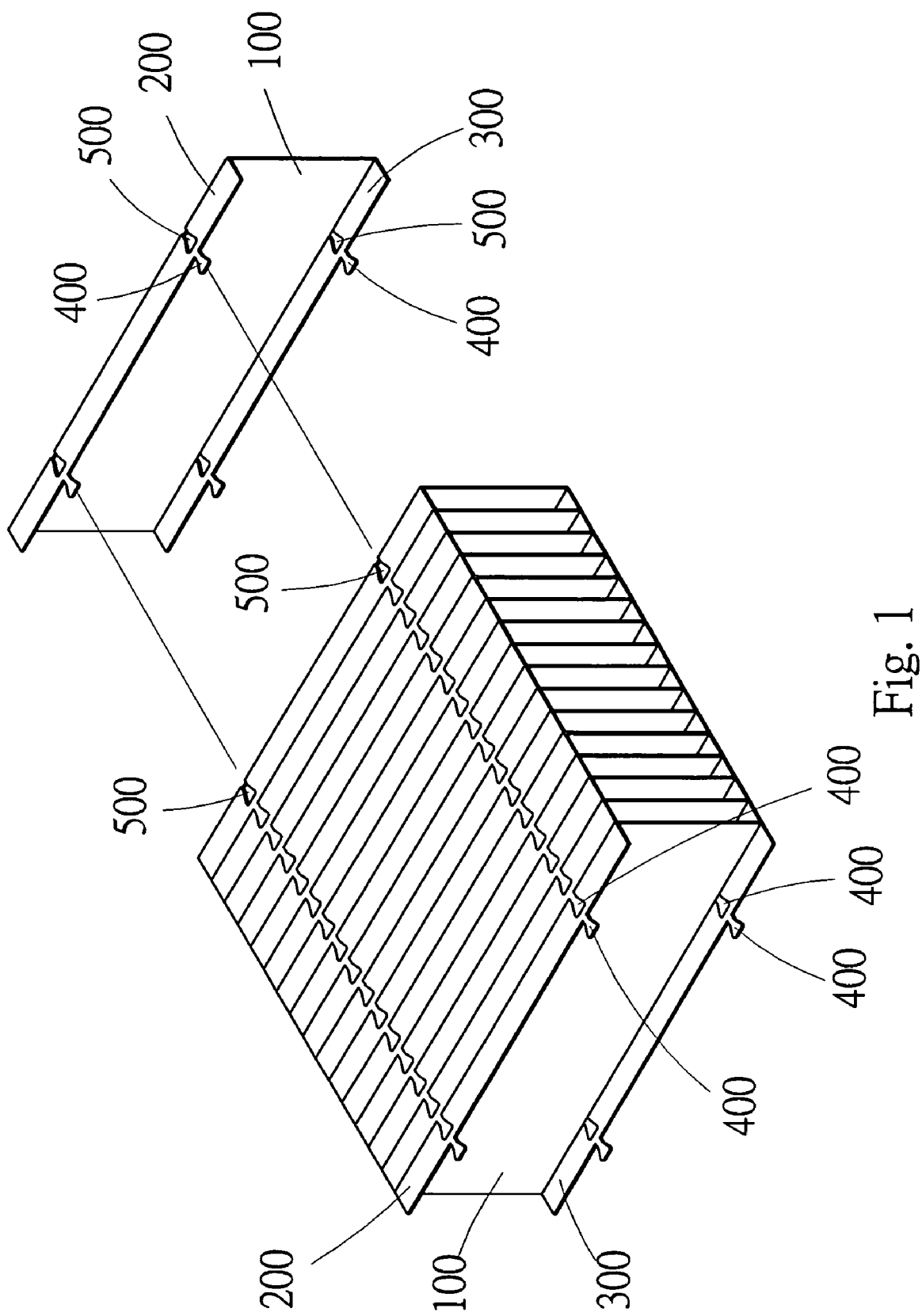
FIG. 1 shows one prior art heat dissipating device.
Figure 2:
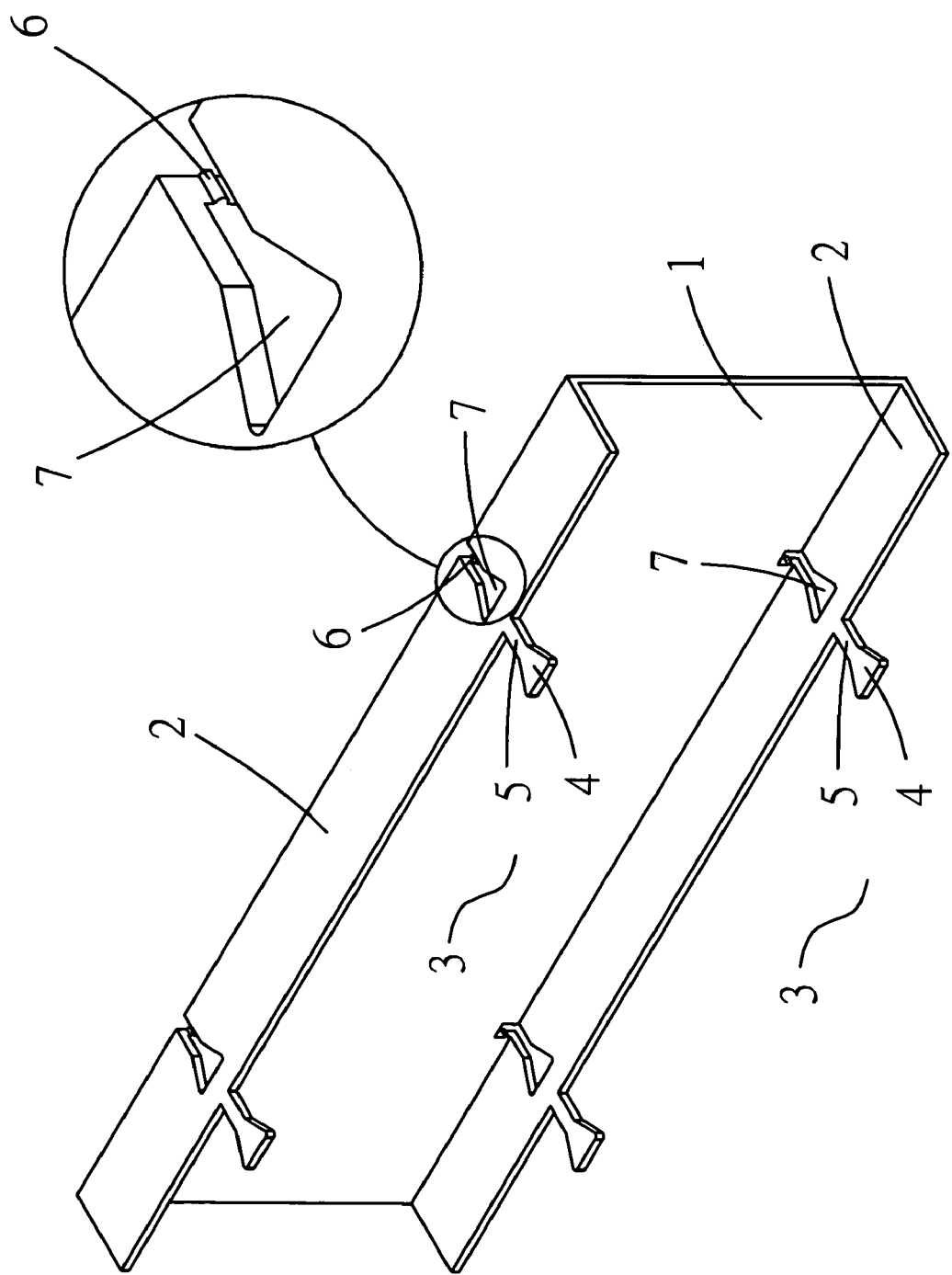
FIG. 2 shows the structure of the first embodiment of the present invention.
Figure 3:
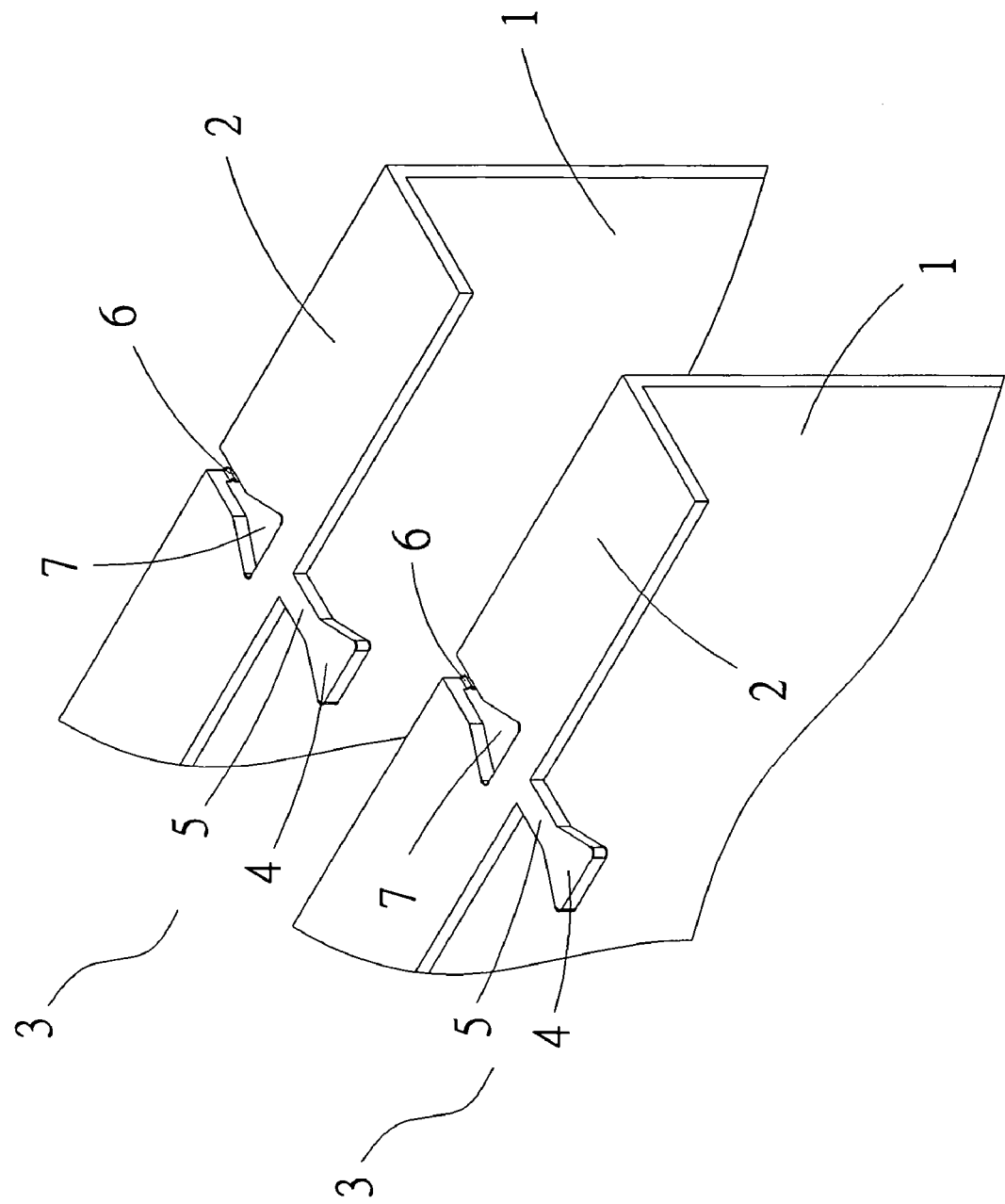
FIG. 3 is a detail view of the first embodiment of the present invention.
Figure 4:
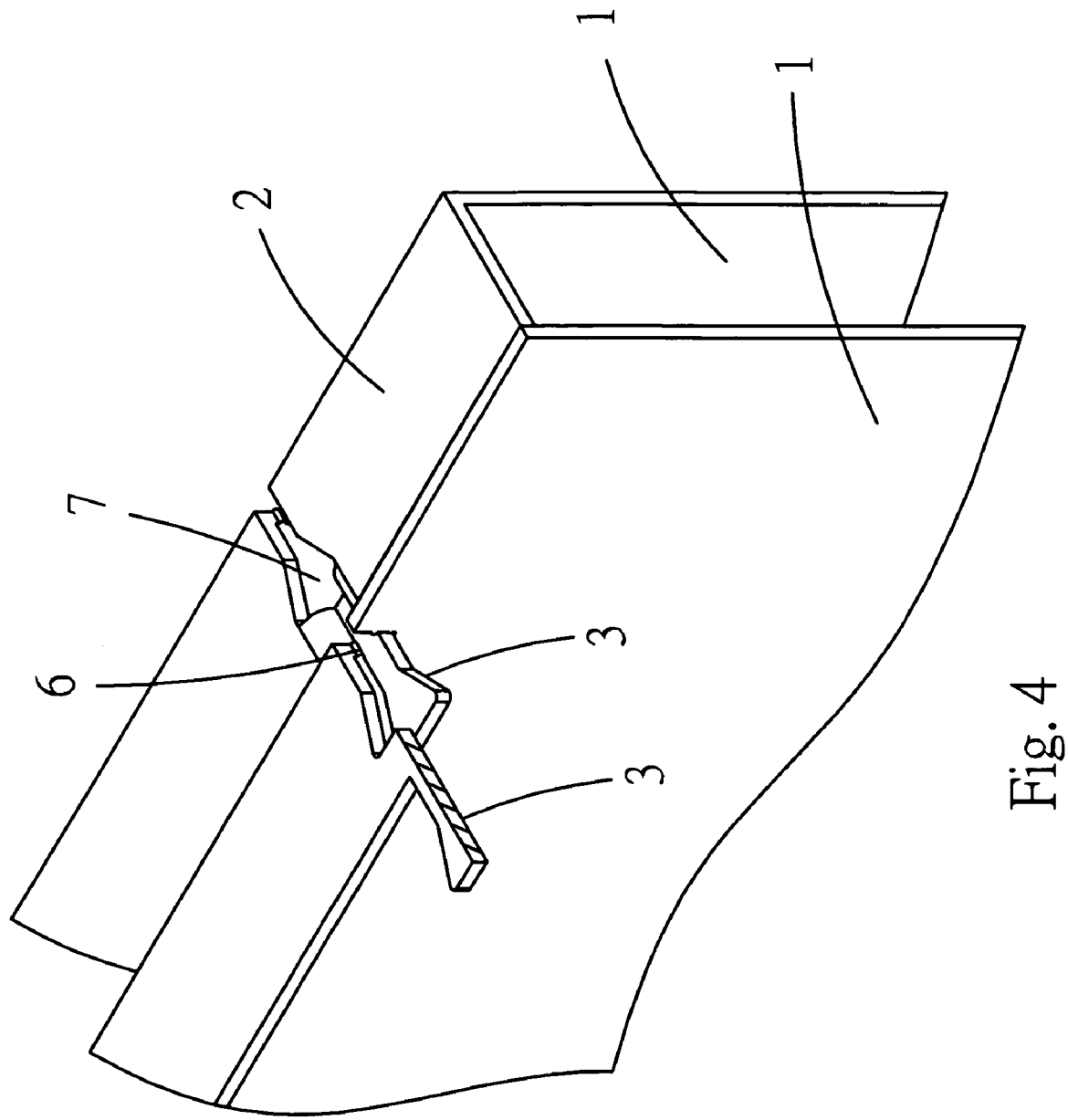
FIG. 4 is an assembled view of the first embodiment of the present invention, wherein two fins are assembled.
Figure 5:
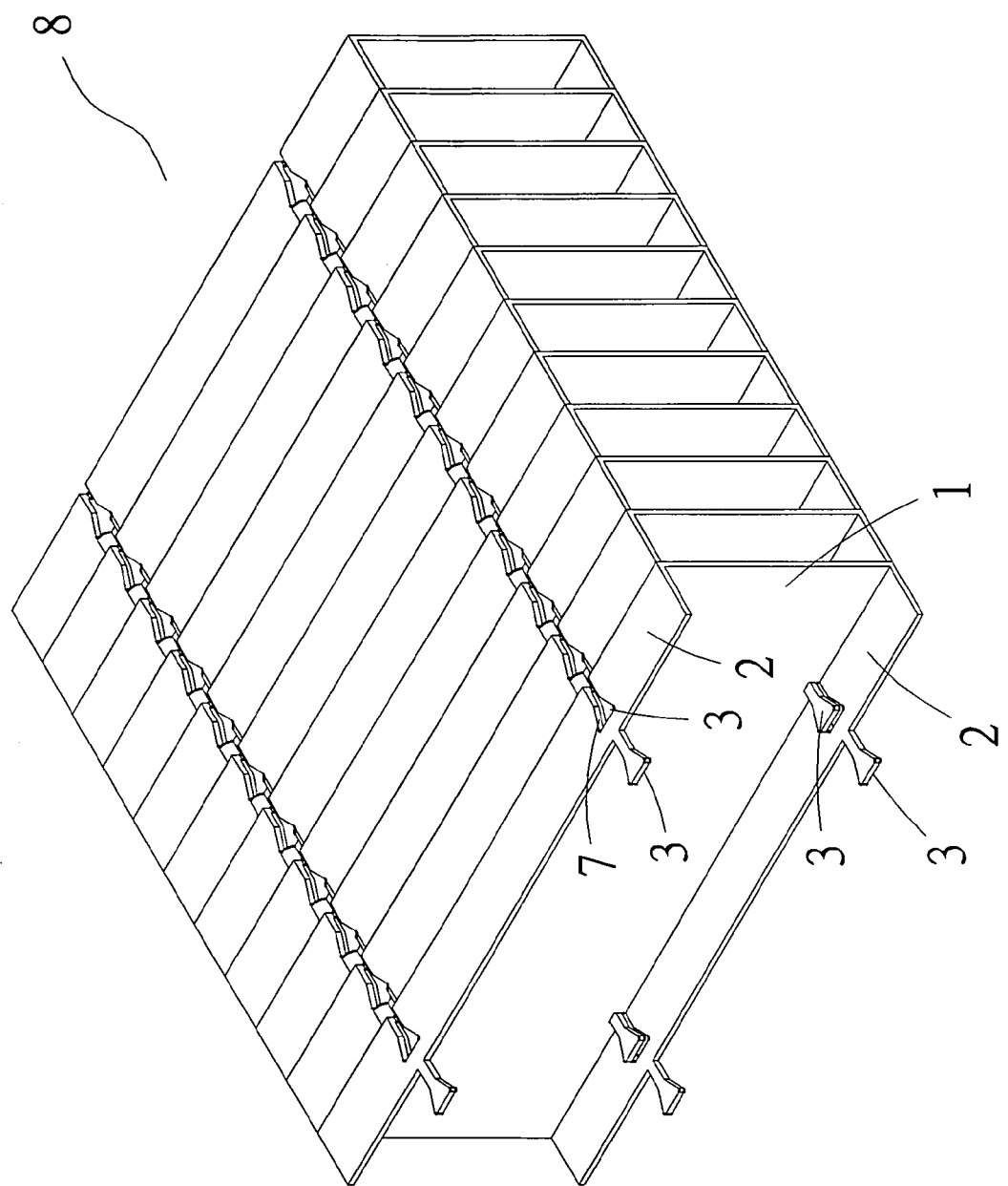
FIG. 5 is an assembled view of the heat dissipating device in the first embodiment of the present invention.

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Referring to FIGS. 2 to 5, the heat dissipating device of the present invention is illustrated. The present invention has the following elements.

A plurality of fins 1 is included. An upper side and a lower side of each fin 1 is folded with folding sheets 2. Each of two sides of each sheet 2 is protruded with a buckling ear 3. The buckling ear 3 is formed by a triangular sheet 4 and a support plate 5. The support plate 5 is connected to one apex of the triangular sheet 4. A hole 7 is formed on the folding sheet 2 and is located behind the buckling ear 3. The shape of the hole 7 is corresponding to that of the buckling ear 3. A tenon 6 is formed at two lateral walls of the hole and a middle section of the tenon being protruded with a semi-round section. In assembly the buckling ears 3 of one fin 1 are buckled to the holes 7 of another fin 1 so as to assembly two fins. The tenon 6 serves to buckle the buckling ear 3 to the hole 7. More fins 1 can be assembled by the same way (referring to FIG. 5). The heat dissipating device can be assembled to a computer central processing unit, which is effective in heat dissipation. The assembly of the present invention is easy and quick and it can provide preferred heat dissipating effect.

Figure 6:
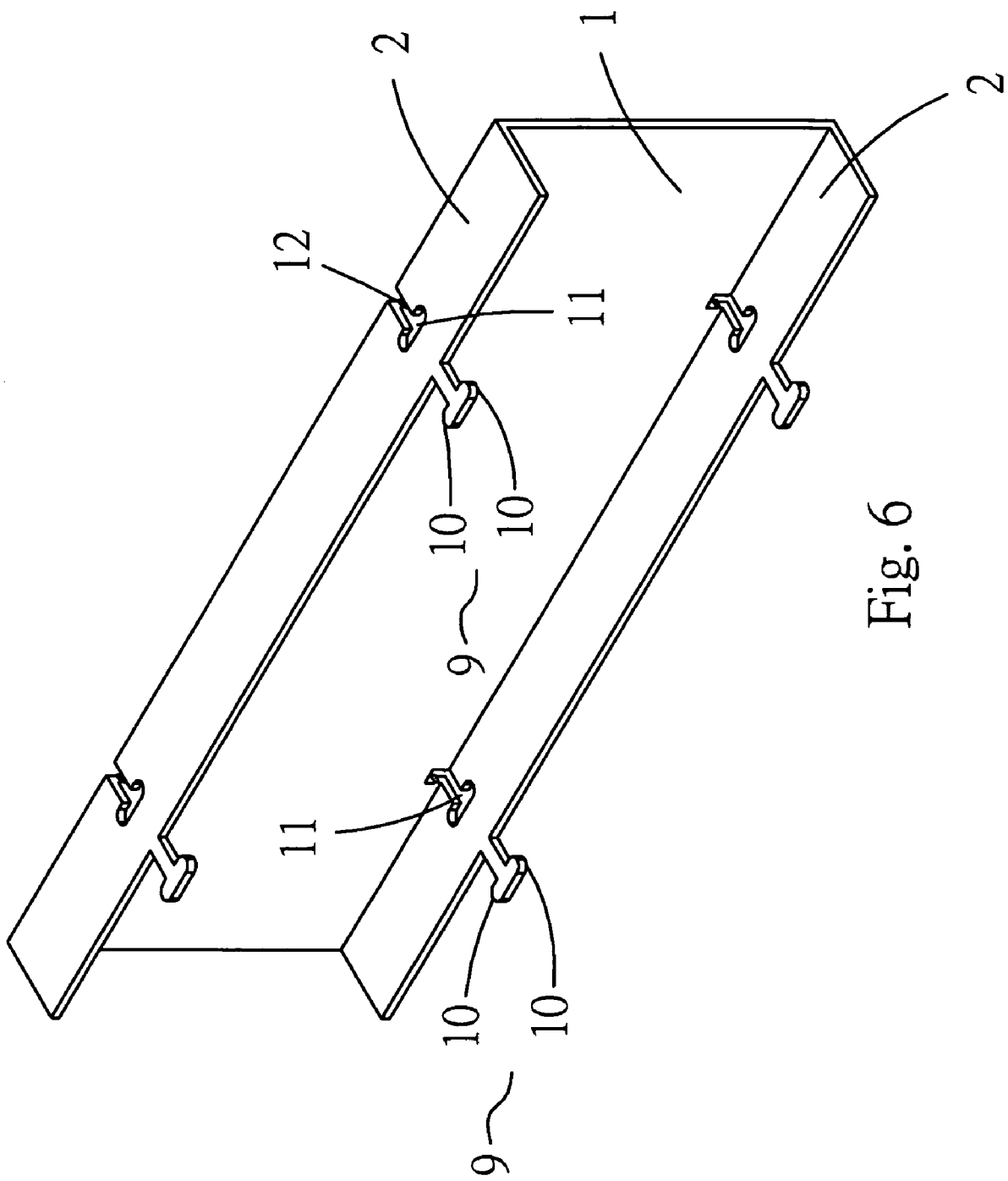
FIG. 6 shows the second embodiment of the present invention.

Referring to FIG. 6, the second embodiment of the present invention is illustrated. Those identical to the first embodiment will not be described. Only those differences are described. In this embodiment, the buckling ear 9 has a T shape and the hole 11 has also a T shape. A tenon 12 is installed on an inner side of the hole 11. A tenon 12 is formed at two lateral walls of the hole and a middle section of the tenon being protruded with a semi-round section. The area of the hole 11 is slightly greater than that of the buckling ear 9. In assembly the buckling ears 9 of one fin 1 are buckled to the holes 11 of another fin 1 to assembly the two fins together. More fins 1 can be assembled by the same way. The heat dissipating device can be assembled to a computer central processing unit, which is efficient in heat dissipation. The assembly of the present invention is easy and quick and it can provide preferred heat dissipating effect.

Figure 7:
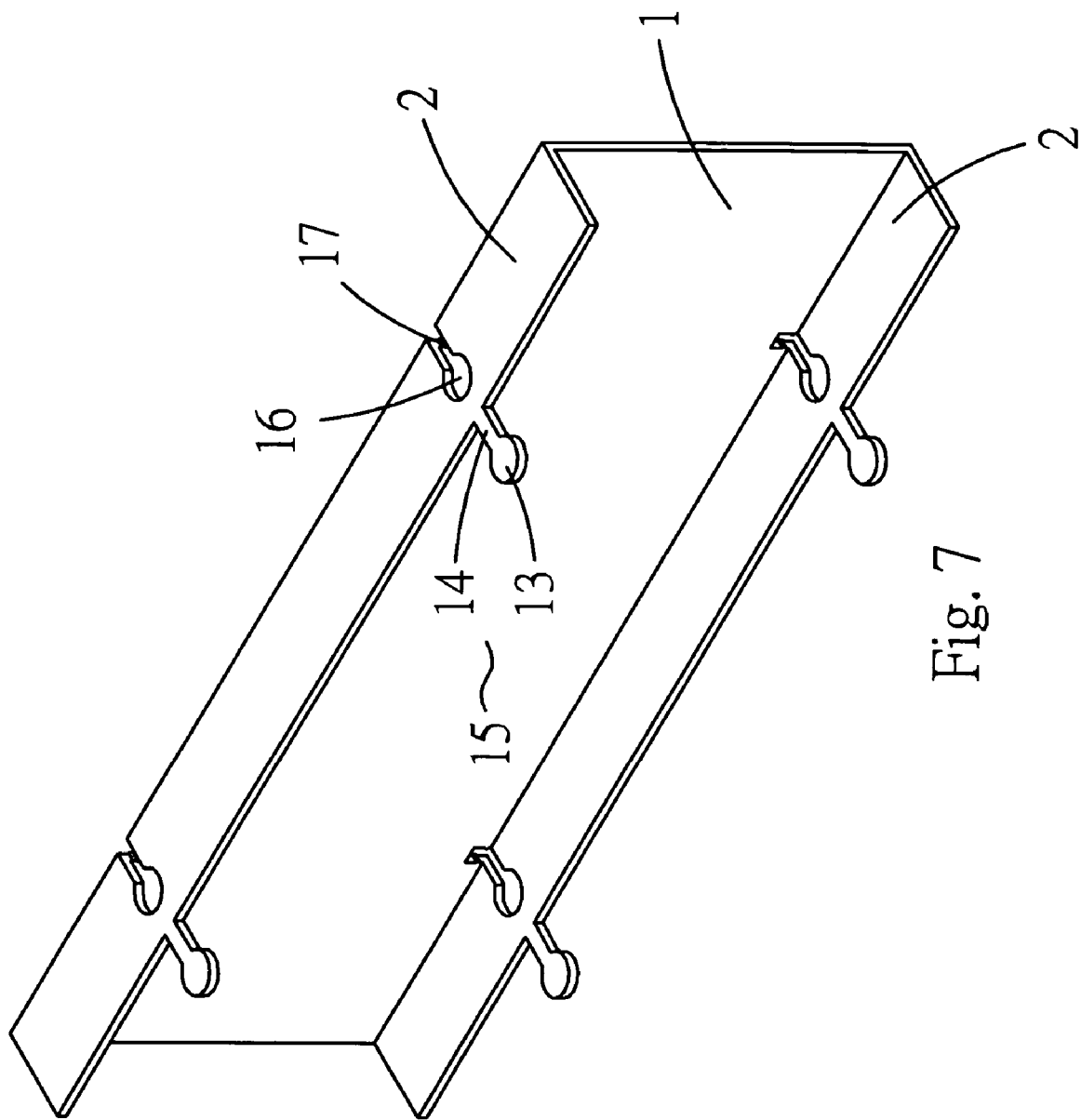
FIG. 7 shows the third embodiment of the present invention.

Referring to FIG. 7, the second embodiment of the present invention is illustrated. Those identical to the first embodiment will not be described. Only those differences are described. In this embodiment, the buckling ear 15 is formed by a round sheet 13 and a support plate 14. The support plate 14 is connected between the folding sheet 2 and the round sheet 13. The hole 16 has a shape corresponding to that of the buckling ear 3. A tenon 17 is formed at two lateral walls of the hole and a middle section of the tenon being protruded with a semi-round section. In assembly the buckling ears 15 of one fin 1 are buckled to the holes 16 of another fin 1 so as to assembly the two fins together. More fins 1 can be assembled by the same way (referring to FIG. 5). The heat dissipating device can be assembled to a computer central processing unit, which is effective for heat dissipation. The assembly of the present invention is easy and quick and it can provide preferred heat dissipating effect.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat dissipating device comprising:
a plurality of fins; an upper side and a lower side of each fin being folded with folding sheets; each of two sides of each sheet being protruded with a buckling ear; the buckling ear being formed by a triangular sheet and a support plate; the support plate being connected to one apex of the triangular sheet and the folding sheet; a hole being formed on the folding sheet and being located behind the buckling ear; the shape of the hole being corresponding to that of the buckling ear; a tenon being formed at two lateral walls of the hole and a middle section of the tenon being protruded with a semi-round section;

wherein in assembly, the buckling ears of one fin are buckled to the holes of another fin so as to assembly two fins together; the tenon serves to buckle the buckling ear to the hole; more fins are assembled by the same way; the heat dissipating device can be assembled to a computer central processing unit.

* * * * *